United States Patent [19]

Usui et al.

[11] Patent Number: 4,852,167

[45] Date of Patent: Jul. 25, 1989

[54] FMX STEREOPHONIC RECEIVER

[75] Inventors: Noboru Usui; Kanji Tanaka, both of Oota; Ryuichi Ogawa, Oora; Tsutomu Ishikawa, Oota; Kazuhisa Ishiguro, Nitta; Masashi Arai, Oora, all of Japan

[73] Assignee: Sanyo Electric Co., Ltd., Moriguchi, Japan

[21] Appl. No.: 143,805

[22] Filed: Jan. 14, 1988

[30] Foreign Application Priority Data

Jan. 20, 1987 [JP] Japan .................................. 62-10723
Jan. 20, 1987 [JP] Japan .................................. 62-6137[U]
Jan. 20, 1987 [JP] Japan .................................. 62-6138[U]

[51] Int. Cl.⁴ .............................................. H04H 5/00
[52] U.S. Cl. ...................................... 381/13; 381/106
[58] Field of Search ............................. 381/13, 106, 4

[56] References Cited

U.S. PATENT DOCUMENTS

| | | | |
|---|---|---|---|
| 4,195,203 | 3/1980 | Sakai et al. | 381/13 |
| 4,485,483 | 11/1984 | Torick et al. | 381/14 |
| 4,602,380 | 7/1986 | Stebbings | 381/13 |
| 4,602,381 | 7/1986 | Cugnini et al. | 381/13 |
| 4,674,122 | 6/1987 | Orban | 381/13 |
| 4,704,727 | 11/1987 | Beard | 381/13 |
| 4,751,734 | 6/1988 | Rucktenwald | 381/13 |
| 4,752,955 | 6/1988 | Torick | 381/13 |

OTHER PUBLICATIONS

Torick and Keller, "Improving the Signal-to-Noise Ratio and Coverage of FM Stereophonic Broadcasts", Journal AES, vol. 33, No. 12, Dec. 1985.

Primary Examiner—Forester W. Isen
Attorney, Agent, or Firm—Darby & Darby

[57] ABSTRACT

An FMX stereophonic receiver receives an FMX stereophonic broadcast signal which includes a stereo sum signal, an uncompressed stereo difference signal, and a compressed stereo difference signal which is formed by modulating the uncompressed stereo difference signal by a quadrature modulation and being compressed. The FMX stereophonic receiver includes an FM detector for producing an FM detection signal including a stereo pilot signal, a PLL circuit for producing a signal which is in a synchronized relationship with the stereo pilot signal included in the FM detection signal, a synchronous detection circuit for receiving the FM detection signal and for producing the uncompressed stereo difference signal in accordance with the signal produced from the PLL circuit, a quadrature detection circuit for receiving the FM detection signal and for producing the compressed stereo difference signal in accordance with the signal produced from the PLL circuit, and a phase shifting means for shifting the phase of at least one of the FM detection signal applied to the PLL circuit and the FM detection signal applied to the detection circuits so as to correct the phase difference between the synchronous detection signal and the signal to be detected.

8 Claims, 4 Drawing Sheets

Fig. 1
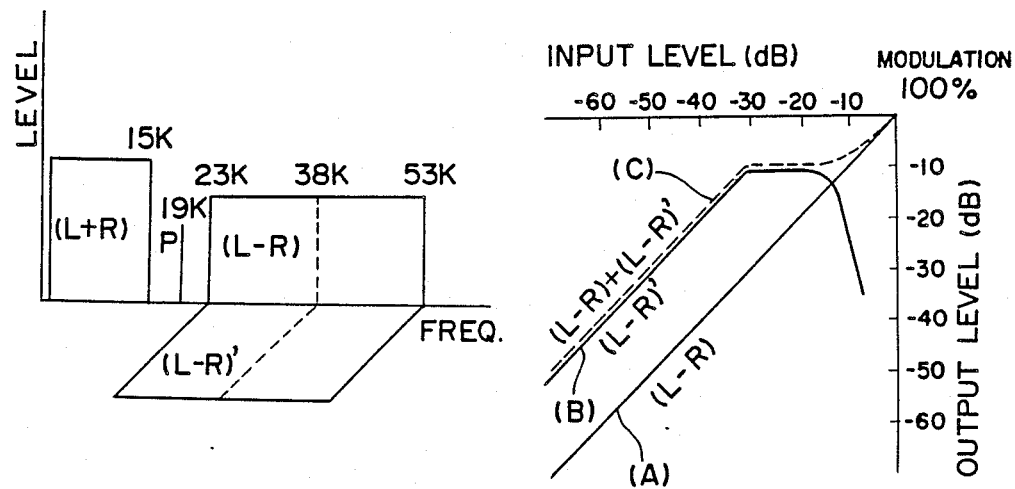
Fig. 2
Fig. 3 PRIOR ART
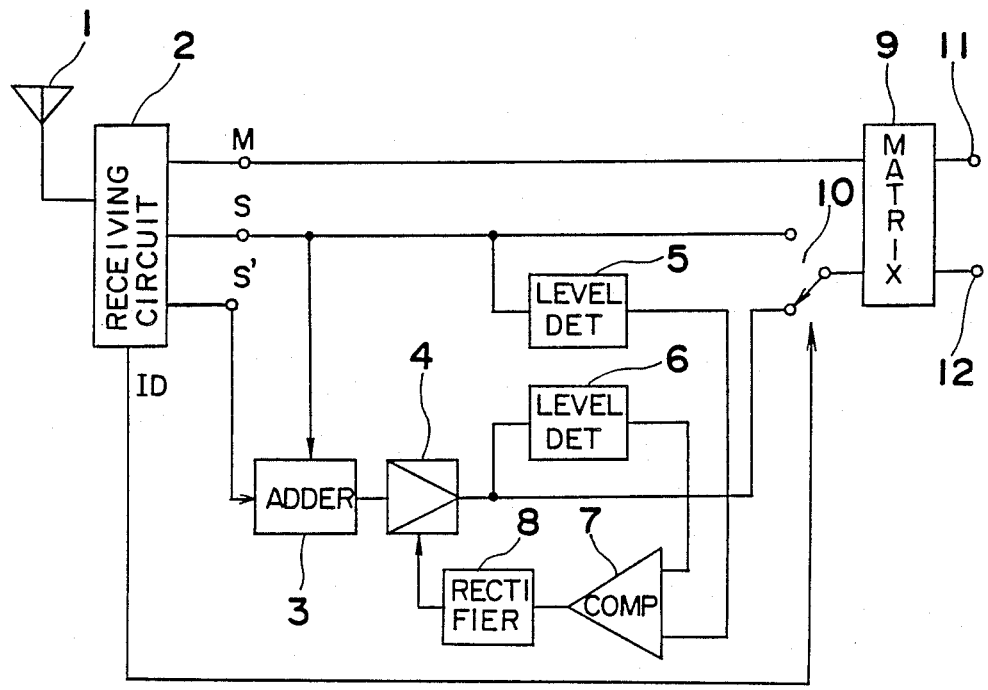

FMX STEREOPHONIC RECEIVER

BACKGROUND OF THE INVENTION

1. Field of the Invention

The present invention relates to an FMX stereophonic receiver and, more particularly, to an FMX stereophonic receiver able to prevent deterioration of stereophonic channel separation caused by phase shifting.

2. Description of the Prior Art

FMX stereophonic broadcasting has been proposed as one means of enlarging the service area and improving the signal-to-noise ratio characteristics of FM stereo broadcasts. The transmission signal of the aforementioned FMX stereo broadcast includes a compressed stereo difference signal (L−R)' broadcast simultaneously with the transmission signal of conventional FM stereo broadcasting, for example, a stereo sum signal (L+R) and stereo difference signal (L−R). The transmission signal can be expressed as:

$$f(t) = (L+R) + P\sin(w/2)t + (L-R)\sin wt + (L-R)\text{-'}\cos wt \quad (1)$$

where L+R is a stereo sum signal, L−R is a stereo difference signal, P is a stereo pilot signal, and w is the subcarrier angular frequency. As shown by aforementioned Equation (1), compressed stereo difference signal (L−R)' is quadrature modulated from uncompressed stereo difference signal (L−R), resulting in an FMX stereo broadcast transmission signal spectrum shown in FIG. 1.

Furthermore, the relationship between the uncompressed stereo difference signal (L−R) and the compressed stereo difference signal (L−R)' is as shown in FIG. 2 which expresses the compression characteristics. In FIG. 2, when the input signal level is low, the aforementioned signal (L−R)' is 20 dB greater than the uncompressed stereo difference signal (L−R) and, at the same time, input/output characteristics become linear, and also the compression ratio becomes 1:1. When the level of the input signal is medium (approximately −30 dB), the compression ratio becomes ∞:1, and input/output characteristics are flat over a range of approximately 10 dB. When the input signal level becomes high, the aforementioned signal (L−R)' rapidly attenuates. Therefore, compressed stereo difference signal (L−R)' is as shown by solid line B in FIG. 2 with respect to stereo difference signal (L−R) (solid line A), and the sum signal of the aforementioned signal (L−R) and the aforementioned signal (L−R)' is as shown by dotted line C in FIG. 2.

As discussed above, the transmission signal for FMX stereophonic broadcasting is received by a receiver as shown in FIG. 3. In FIG. 3, the FMX stereophonic broadcast transmission signal received by antenna 1 is received by a receiving circuit 2 of the same construction as a conventional FM stereophonic receiver in which stereo sum signal (L+R) (hereafter referred to as M), stereo difference signal (L−R) (hereafter referred to as S), and compressed stereo difference signal (L−R)' (hereafter referred to as S') are each demodulated. When the received signal is detected by the FM detection circuit included in the receiving circuit, stereo sum signal M is demodulated. When the stereo composite signal is detected by the synchronous detection using the 38-kHz subcarrier signal obtained from the PLL in the receiving circuit, uncompressed stereo difference signal S is demodulated. And when the stereo composite signal is detected by the quadrature detection, compressed stereo difference signal S' is demodulated.

Uncompressed and compressed stereo difference signals S and S' obtained from receiving circuit 2 are added by adder 3, and the result is applied to VCA (voltage control amplifier) 4 operating as an attenuator. When stereo difference signal S and output signal (S+S') of VCA 4 are greater than a specified level (a knee-point level), first and second level detection circuits 5 and 6, each having a threshold level, operate in such a manner that the level of stereo difference signal S and the level of aforementioned output signal (S+S') of VCA 4 are respectively detected by first and second level detection circuits 5 and 6, and are compared by comparator circuit 7. Next, a signal according to the level difference obtained from aforementioned comparator circuit 7 is rectified and smoothed by rectifying circuit 8, and the rectified signal is applied to VCA 4 as a control signal. The output signal (S+S') of aforementioned VCA 4 is controlled by this control signal to be equal to the level of stereo difference signal S. However, when aforementioned stereo difference signal S and output signal (S+S') of VCA 4 are below the knee-point level, first and second level detection circuits 5 and 6 do not operate, and attenuation at VCA 4 is fixed at approximately 20 dB.

Although stereo sum signal M obtained from receiving circuit 2 is applied directly to matrix circuit 9, stereo difference signal S or output signal (S+S') of VCA 4 are selected by switch 10, and applied to matrix circuit 9. Although not given in the above description, a 10-Hz ID signal is included in the FMX stereophonic broadcast transmission signal, and FMX stereophonic broadcasts are differentiated from conventional FM stereophonic broadcasts by the aforementioned ID signal. In addition, because a detection circuit which detects the aforementioned ID signal is built in to receiving circuit 2, whether the broadcast is FMX stereo or not can be determined with the output signal of the aforementioned detection circuit. Switch 10 is controlled by the aforementioned ID signal. When the ID signal is present, switch 10 is switched to a position as shown in FIG. 3. Accordingly, stereo sum signal M and output signal (S+S') from level controlled VCA 4 are matrixed, and left and right stereo signals L and R are generated at left and right output terminals 11 and 12. Furthermore, when the ID signal is not present, switch 10 is switched to a position opposite to that shown in FIG. 3, and stereo sum signal M and stereo difference signal S are matrixed in matrix circuit 9.

As described above, because FMX stereophonic broadcast system uses compressed and expanded stereo difference signal S, it is possible to achieve significant improvements in the S/N ratio, and the service area can be enlarged comparably equal to that of the conventional monaural FM broadcast system.

It is to be noted that the FMX stereophonic broadcast transmission signal can be accurately received by a conventional FM stereophonic receiver. In this case, compressed stereo difference signal S' is quadrature modulated with respect to stereo difference signal S, and reception is not adversely affected.

Details concerning FMX stereophonic broadcasting are disclosed, for example, in an article "Improving the Signal-to-Noise Ratio and Coverage of FM Stereophonic Broadcasts" by Emil L. Torick and Thomas B. Keller in "JOURNAL OF THE RADIO ENGI- NEERING SOCIETY", volume 33, number 12, issued December 1985.

Because FMX stereophonic broadcasting is currently in the experimental stage, and there is no current broadcasting available, FMX stereophonic receivers are, of course, not commercially available. However, when a receiver in FIG. 3 was actually designed and experimented with a test signal to measure the characteristics, channel separation during FMX stereophonic broadcast reception was found to deteriorate. Specifically, uncompressed stereo difference signal S and compressed stereo difference signal S' are synchronously detected and quadrature detected, respectively, using a signal obtained from a PLL circuit locked to a 19-kHz pilot signal included in an FM detection output signal. However, if the phase relationship between the phases of the detection signal and the signal to be detected undesirably deviates due to the phase characteristics of a frequency divider provided in a PLL circuit, or due to an offset of the phase comparator provided in the PLL circuit, normal detection output cannot be obtained. Accordingly, when output signal (S+S') of VCA 4 and stereo sum signal M are matrixed, separation can not be accomplished in a desired form. A 38-kHz detection signal obtained from the PLL circuit may generally cause a phase shift of about 10 degrees with respect to the 38-kHz subcarrier, but in FMX broadcast system, such a phase shift will result in a great deterioration of the channel separation, because in FMX broadcast system, a phase shift of 2 degrees will result in channel separation deterioration by over 10 dB.

Furthermore, stereo sum signal M, uncompressed stereo difference signal S, and compressed stereo difference signal S' obtained from the receiving circuit each contain a high harmonic frequency component. In a standard FM stereophonic receiver, there are no particular problems even when the signals are matrixed containing the high frequency component. Nevertheless, in the FMX stereophonic receiver, because the level of output signal (S+S') of VCA 4 is controlled according to the level of uncompressed stereo difference signal S, if the high frequency component is applied to the first level detection circuit 5, which detects the uncompressed stereo difference signal S level, the level of the output signal (S+S') of VCA 4 changes, and stereo separation during FMX stereo broadcast reception deteriorates.

Moreover, in the circuit of FIG. 3, there is the additional problem of the circuit becoming complex because two level detection circuits are required, and it is therefore necessary to match the characteristics of both level detection circuits.

SUMMARY OF THE INVENTION

The present invention has been developed with a view to substantially solving the above described problems and has for its essential object to provide an improved FMX stereophonic receiver.

It is also an essential object of the present invention to provide an FMX stereophonic receiver of the above described type which can prevent the deterioration of the received signal.

It is also an essential object of the present invention to provide an FMX stereophonic receiver of the above described type which can be easily manufactured.

In accomplishing these and other objects, an FMX stereophonic receiver according to the present invention comprises an FM detector for producing an FM detection signal including a stereo pilot signal; a PLL circuit for producing a signal which is in a synchronized relationship with the stereo pilot signal included in the FM detection signal; a synchronous detection circuit for receiving the FM detection signal and for producing the uncompressed stereo difference signal in accordance with the signal produced from the PLL circuit; a quadrature detection circuit for receiving the FM detection signal and for producing the compressed stereo difference signal in accordance with the signal produced from the PLL circuit; and a phase shifting means for shifting the phase of at least one of the FM detection signal applied to the PLL circuit and the FM detection signal applied to the detection circuits so as to correct the phase difference between the synchronous detection signal and the signal to be detected.

BRIEF DESCRIPTION OF THE DRAWINGS

These and other objects and features of the present invention will become clear from the following description taken in conjunction with the preferred embodiments thereof with reference to the accompanying drawings throughout which like parts are designated by like reference numerals, and in which:

FIG. 1 is a graph showing an FMX stereo broadcast transmission signal spectrum;

FIG. 2 is a graph showing input/output characteristics of stereo difference signals;

FIG. 3 is a circuit diagram of an FMX stereophonic receiver according to prior art;

DETAILED DESCRIPTION OF THE INVENTION

Figure 4:
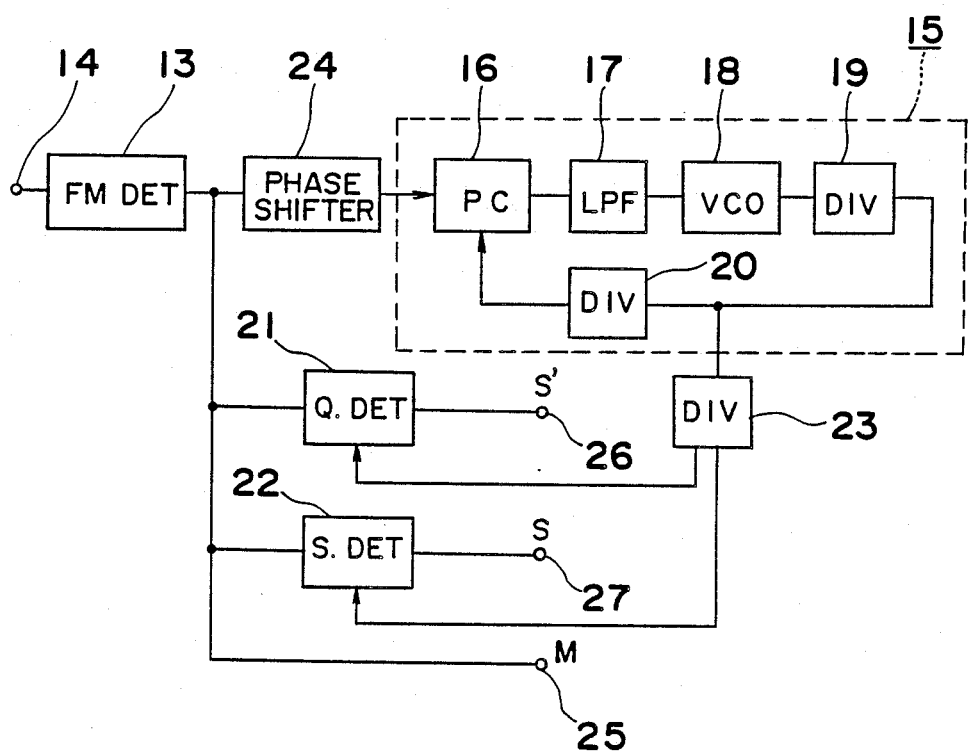
FIG. 4 is a circuit diagram of an FMX stereophonic receiver according to a first embodiment of the present invention.

Referring to FIG. 4 shows a first embodiment of the present invention is shown. In the first embodiment, an improvement is made in receiving circuit 2 shown in FIG. 3. In FIG. 4, a reference number 13 designates an FM detection circuit for the FM detection of an IF signal applied to an input terminal 14, and a reference number 15 designates a PLL circuit which generates an output signal synchronized to a 19-kHz stereo pilot signal. PLL circuit 15 includes a phase comparator circuit 16, low pass filter 17, VCO 18, and first and second frequency dividers 19 and 20. A reference number 21 is a quadrature detector for effecting the quadrature detection of a compressed stereo difference signal S' included in an output signal from FM detection circuit 13 using a 38-kHz (90° phase angle) detection signal obtained from a third frequency divider 23 of said PLL circuit 15. A reference number 22 is a synchronous detection circuit which detects an uncompressed stereo difference signal included in the output signal of FM detection circuit 13 using a 38-kHz (0° phase angle) detection signal obtained from the third frequency divider 23; and a reference number 24 is a variable phase shifter which shifts a 19-kHz stereo pilot signal and is located at the input side of PLL circuit 15.

Stereo sum signal M, uncompressed stereo difference signal S, compressed stereo difference signal S', and 19-kHz stereo pilot signal P are included in an output signal of FM detection circuit 13, and when a signal is passed through a low pass filter (not shown), stereo sum signal M is obtained at a first output terminal 25.

Furthermore, the pilot signal P has its phase compared in a phase comparator 16 with a 19-kHz signal obtained from a second frequency divider 20 provided in PLL circuit 15, and a phase difference signal obtained therefrom is applied through a low pass filter 17 to VCO 18. Accordingly, VCO 18 produces an oscillation signal synchronized to the pilot signal P. The third frequency divider 23 divides the oscillation signal from VCO 18, and produces two 38-kHz (0° and 90° phase angle) signals to be used as a detection signal. Quadrature detector 21 detects compressed stereo difference signal S' included in the output of FM detection circuit 13 using the aforementioned detection signal. Therefore, compressed stereo difference signal S' is produced at second output terminal 26 which is connected to the output of quadrature detector 21. Synchronous detector 22 synchronously detects uncompressed stereo difference signal S included in the output signal of FM detection circuit 13 using a 38-kHz (0° phase angle) signal obtained from third frequency divider 23 as the detection signal. Therefore, uncompressed stereo difference signal S is produced from the third output terminal 27 which is connected to the output of synchronous detector 22.

Figure 7:
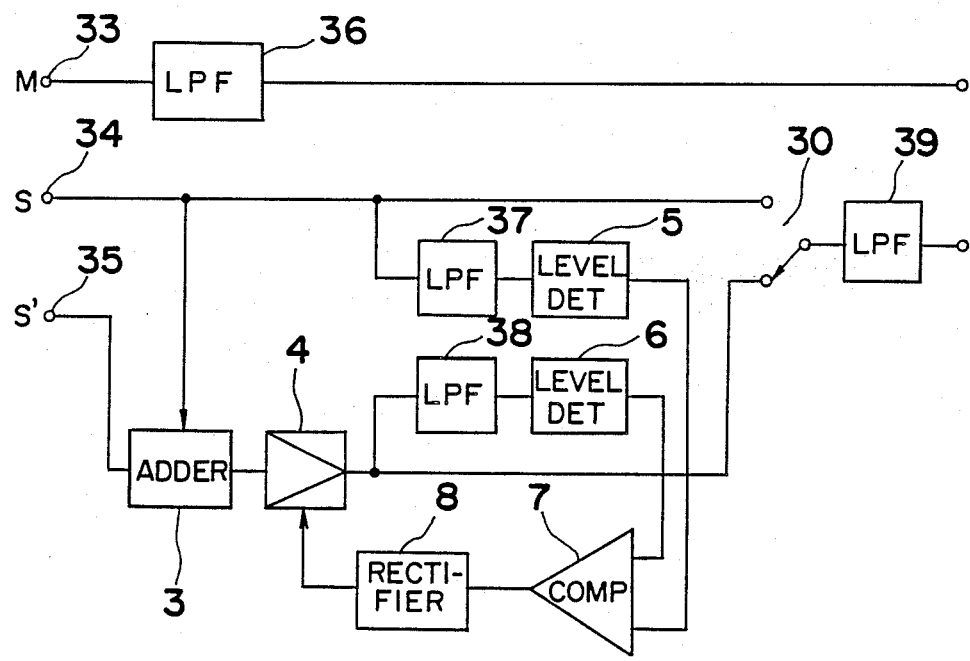
FIG. 7 is a circuit diagram of an FMX stereophonic receiver according the a second embodiment of the present invention.
Figure 8:
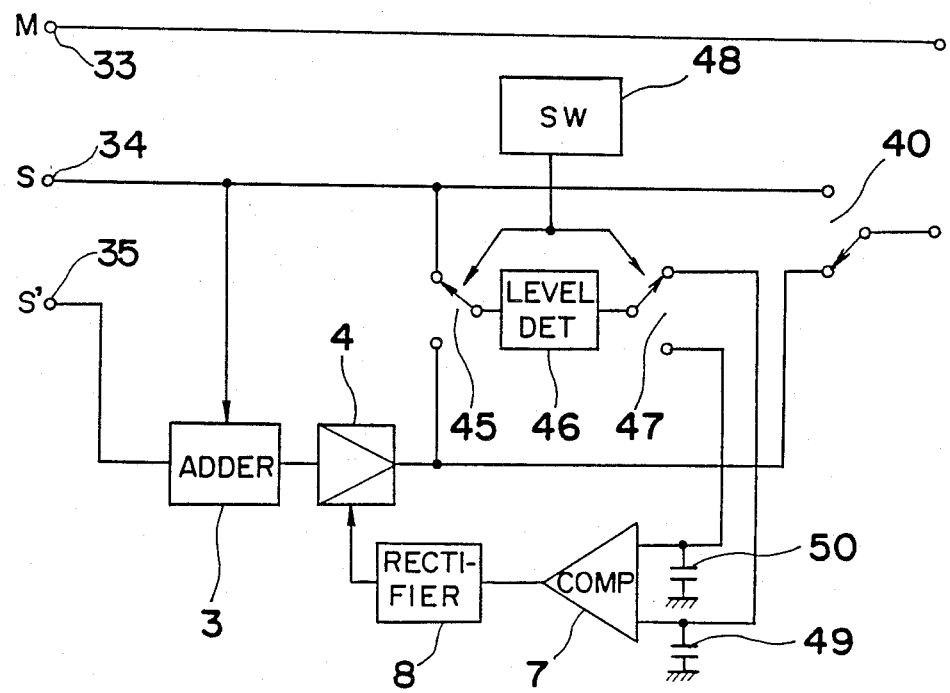
FIG. 8 is a circuit diagram of an FMX stereophonic receiver according the a third embodiment of the present invention.

Compressed stereo difference signal S' and uncompressed stereo difference signal S obtained at second and third output terminals 26 and 27 are applied to adder 3 shown in FIG. 3, FIG. 7, or FIG. 8, and after expansion processing, they are matrixed in matrix circuit 9 together with stereo sum signal M produced from the first output terminal 25.

In the case where there is a difference in phase between the 38-kHz signal obtained from PLL circuit 15 and the 38-kHz subcarrier, a crosstalk of stereo difference signal S occurs in quadrature detector 21 and a crosstalk of compressed stereo difference signal S' occurs in synchronous detector 22. Accordingly, the linearity of the uncompressed stereo difference signal S deteriorates, resulting in such a problem that, accurate expansion during expansion processing does not occur, and that the linearity of output signal (S+S') of VCA 4 also deteriorates. Accordingly, this induces deterioration of stereo channel separation during both FM stereo reception and FMX stereo reception.

Figure 5:
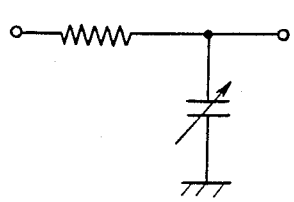
FIG. 5 is a circuit diagram of a phase delay circuit used in the circuit of FIG. 4.
Figure 6:
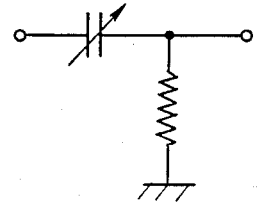
FIG. 6 is a circuit diagram of a phase advance circuit used in the circuit of FIG. 4.

In order to improve such a drawback, in the first embodiment show in FIG. 4, phase shift circuit 24 of a variable phase shift type is provided between FM detector 13 and phase comparator 16 provided in PLL circuit 15 to shift the phase to a correct position. The phase shift circuit 24 is composed of a phase delay circuit, such as shown in FIG. 5, or a phase advance circuit, such as shown in FIG. 6. The phase shift is carried out, for example, in such a manner that an FMX IF signal containing only the compressed stereo difference signal S' and not the uncompressed stereo difference signal S is applied to the input side of FM detection circuit 13, and the phase is so shifted by phase shift circuit 24 so that the crosstalk of compressed stereo difference signal S' produced at the output of synchronous detector 22 will be made zero. Since the compressed stereo difference signal S' has a level 20 dB greater than the uncompressed stereo difference signal S, a crosstalk with respect to the output of synchronous detector 22 will be also extremely high. Also, since the output signal S of the synchronous detector 22 is used as a reference signal during expansion, the above mentioned crosstalk especially has a significant influence on deterioration of separation. Therefore, as discussed above, when the crosstalk in the output of synchronous detector 22 is made zero by adjusting the phase shift amount of phase shift circuit 24, the reference level during expansion processing will be made accurate and, at the same time, the level of signal (S+S') applied to matrix circuit 9 from VCA 4 of FIG. 3 will also be made accurate, thereby improving the stereophonic channel separation.

Figure 9:
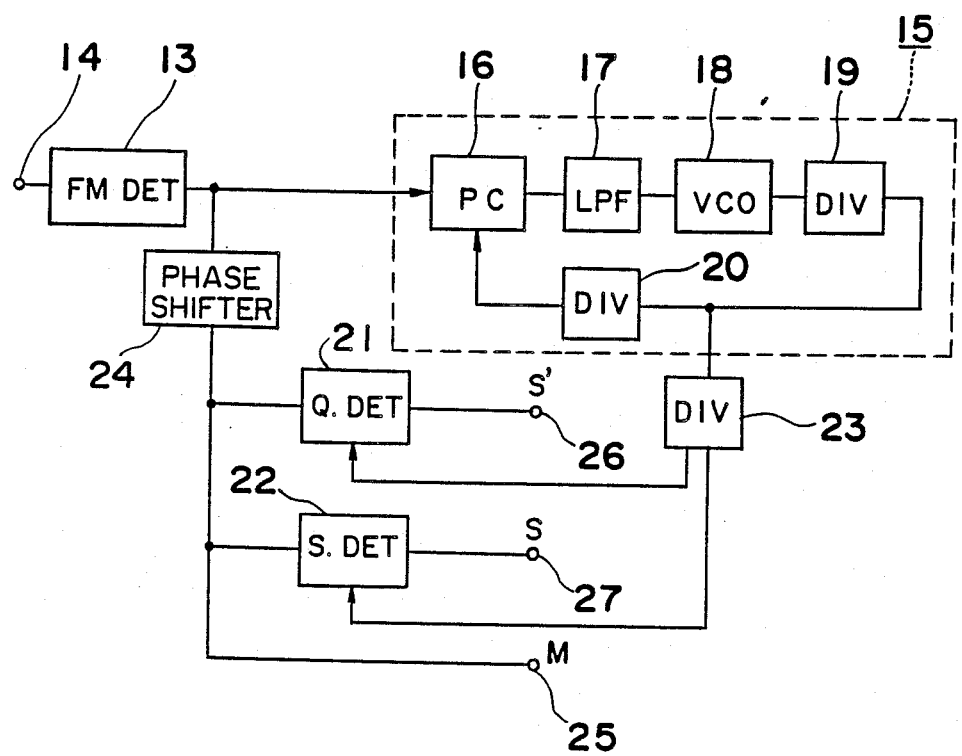
FIG. 9 is a circuit diagram similar to FIG. 3 illustrating an alternate construction for achieving the same result.

Insertion of phase shift circuit 24 at the input side of PLL circuit 15 has been explained in the first embodiment shown in FIG. 4. As discussed above, because it is sufficient if stereo difference signal S which is the reference signal for expansion processing is correctly detected, insertion of phase shift circuit 24 at the input side of quadrature detector 21 and synchronous detector 22, as illustrated in FIG. 9, is also possible instead of insertion at the input side of PLL circuit 15. Moreover, the phase shift can be automatically corrected and the adjustment of the receiver can be simplified by generating a control signal through an arithmetic processing of the output signals of synchronous detector 22, quadrature detector 21, and adder 3 and, at the same time, by constructing phase shift circuit 24 with a variable reactance circuit, so that phase shift circuit 24 automatically varies the reactance of the variable reactance circuit according to the control signal.

As described above, according to the circuit shown in FIG. 4, because it is possible to match the phase of the detection signal produced from the PLL circuit and the phase of the detected signal produced from the FM detection circuit, it is possible to correctly detect the uncompressed stereo difference signal and the compressed stereo difference signal. Therefore, deterioration of stereo channel separation can be prevented, and an FMX stereophonic broadcasting receiver with a superior sense of sound can be provided.

Referring to FIG. 7, a circuit diagram of a receiver according to a second embodiment of the present invention is shown. In the second embodiment, the improvement is made in connection with the level detectors 5 and 6 shown in FIG. 3. In FIG. 7, a reference number 33 is a first input terminal to which detected stereo sum signal M is applied; 34 is a second input terminal to which detected uncompressed stereo difference signal S is applied; 35 is a third input terminal to which detected compressed stereo difference signal S' is applied; 36 is a first low-pass filter which removes the high frequency component of the signal applied to aforementioned first input terminal 33; 37 is a second low-pass filter connected to the input side of first level detection circuit 5; 38 is a third low-pass filter connected to the input side of second level detection circuit 6; and 39 is a fourth low-pass filter which removes the high frequency component included in the signal obtained at the output side of switch 30. The description on the circuits 3 through 8 which has been already described in connection with FIG. 1 will be omitted for the sake of brevity.

Because the high frequency component included in a signal applied to second input terminal 34 is removed by a second low-pass filter 37, only the uncompressed stereo difference signal S which does not include a high frequency component is applied to first level detection circuit 5. Therefore, an output signal correctly showing the level of the uncompressed stereo difference signal S is generated at the output side of aforementioned first level detection circuit 5. Similarly, because the high frequency component included in an output signal of VCA 4 is removed by third low-pass filter 38, the output signal of a second level detection circuit 6 correctly shows the level of signal (S+S'). The output signals of first and second level detection circuits 5 and 6 are compared in comparator 7, and a level difference signal produced from comparator 7 is applied to VCA 4. Accordingly, an output signal (S+S') from VCA 4 corresponds to stereo difference signal S. In this case, the second and third low-pass filters 37 and 38 are provided only to improve the precision of level detection. Therefore, the signal which should be matrixed does not pass through the low pass filters and, thus, it is not necessary to accurately match the phase characteristics of both low-pass filters.

A first low-pass filter 36 is provided to remove the high frequency component included in stereo sum signal M, and a fourth low-pass filter 39 is provided to remove the high frequency component included in uncompressed stereo difference signal S or output signal (S+S') of VCA 4 which ever passes through switch 30. Since the output signals of the first and fourth low-pass filters 36 and 39 are to be applied to matrix circuit 9 and matrixed, the phase characteristics of the first and fourth low-pass filters 36 and 39 must be accurately matched. In this case, adjusting the various characteristics of the two low-pass filters is comparatively simple.

It is to be noted that first and fourth low-pass filters 36 and 39 can be eliminated in a simple FMX stereophonic broadcasting receiver. In this case, a de-emphasis circuit connected to the output side of the multiplex circuit serves as a filter to remove the high frequency component.

As described above, according to the circuit shown in FIG. 7, because filters are provided at the input side of each of first and second level detection circuits provided for expansion of the compressed stereo difference signal, it is not necessary to adjust the characteristics of both of the filters. Therefore, the circuit design and adjustment procedures can be simplified. Furthermore, because it is sufficient to provided two filters even when a filter is inserted in the signal path to be matrixed as shown in FIG. 7, adjustment of the various characteristics of both filters can be done simply.

Referring to FIG. 8, a circuit diagram of a receiver according to a third embodiment of the present invention is shown. In the third embodiment, the improvement is made in connection with the level detectors 5 and 6 shown in FIG. 3. In FIG. 8, reference number 45 is a first switch having an arm selectively connected to either a first fixed terminal which is connected to first input terminal 34 or a second fixed terminal which is connected to the output side of VCA 4; 46 is a level detection circuit the input side of which is connected to the movable arm of the first switch 45; 47 is a second switch having a movable arm which is connected to the output side of aforementioned level detection circuit 46, and is selectively connected to either a first fixed terminal which is in turn connected to one input of comparator 7 or a second fixed terminal which is in turn connected to the other input of comparator 7; 48 is a control circuit which controls switching of the first and second switches 45 and 47; and 49 and 50 are capacitors having a low capacitance for maintaining the input signals of comparator 7.

When first and second switches 45 and 47 are switched to a position as shown in FIG. 8, according to the switch control signal generated from control circuit 48, stereo difference signal S applied to first input terminal 34 passes first switch 45 and is applied to level detection circuit 46, and thus the level is detected. Furthermore, the output signal of level detection circuit 46 is transmitted to second switch 47 and further to comparator 7, so that it is maintained by first capacitor 49.

When first and second switches 45 and 47 are switched to a position which is opposite to the position shown in FIG. 8, according to the switch control signal generated from control circuit 48, output signal (S+S') of VCA 4 is transmitted through first switch 45 to level detection circuit 46, and thus the level is detected. Furthermore, the output signal of level detection circuit 46 is transmitted to second switch 47 and further to comparator 7, so that it is maintained by second capacitor 50. Accordingly, the voltages stored in the first and second capacitors 49 and 50 are compared in comparator 7 to produce the control signal generated according to the difference therebetween. The control signal is then transmitted through rectifying circuit 8 to VCA 4, and accordingly, level control in said VCA 4 is achieved. Therefore, a signal (S+S') greater than the knee-point level generated from adder 3 is level controlled by VCA 4 to be expanded to approximately the same level as the uncompressed stereo difference signal S, and a signal (S+S') less than the knee-point level is level controlled by VCA 4 to be attenuated uniformly by approximately 20 dB.

It is to be note that the switch control signals for changing the switching positions of the first and second switches 45 and 47 as generated from control circuit 48 has a frequency sufficiently high with respect to the frequency of the uncompressed stereo difference signal S and output signal (S+S') of VCA 4, the levels of the stereo difference signal S and output signal (S+S') of VCA 4 can be correctly detected in level detection circuit 46.

As discussed above, according to the circuit shown in FIG. 8, the level of stereo difference signal S and the level of VCA output signal (S+S') can be correctly detected by using a simple level detection circuit. Therefore, according to the present invention, an FMX stereophonic broadcasting receiver of simple construction and having an expansion circuit which operates without failure can be provided.

Although the present invention has been fully described with reference to preferred embodiments, many modifications and variations thereof will now be apparent to those skilled in the art, and the scope of the present invention is therefore to be limited not by the details of the preferred embodiments described above, but only by the terms of the appended claims.

What is claimed is:

1. In an FMX stereophonic receiver for receiving an FMX stereophonic broadcast signal which includes a stereo sum signal, an uncompressed stereo difference signal, and a compressed stereo difference signal which is modulated in quadrature with the uncompressed stereo difference signal and being compressed, wherein said FMX stereophonic receiver comprises:

an FM detector for producing an FM detection signal including a stereo pilot signal and a subcarrier signal, a PLL circuit for producing a first signal which is in a synchronized relationship with said stereo pilot signal included in said FM detection signal and a second signal which is 90° phase shifted from said first signal;

a synchronous detection circuit for receiving said FM detection signal and for producing said uncompressed stereo difference signal in accordance with said first signal produced from said PLL circuit;

a quadrature detection circuit for receiving said FM detection signal and for producing said compressed stereo difference signal in accordance with said second signal produced from said PLL circuit, and a phase shifting means for shifting the phase of at least one of said FM detection signal applied to said PLL circuit and said FM detection signal applied to said detection circuits so as to correct the phase difference between the stereo pilot signal contained in the FM detection signal being applied to said PLL circuit and the subcarrier signal contained in the FM detection signal being applied to said synchronous detection circuit and also to said quadrature detection circuit, thereby synchronizing the phases of said first signal and the subcarrier signal of the uncompressed stereo difference signal and also synchronizing the phases of said second signal and the subcarrier signal of the compressed stereo difference signal.

2. An FMX stereophonic receiver as claimed in claim 1 wherein said phase shifting means is inserted at the input side of said PLL circuit.

3. An FMX stereophonic receiver as claimed in claim 1, further comprising:

an adder for adding said uncompressed stereo difference signal and said compressed stereo difference signal;

a level control circuit for controlling the level of the output signal obtained from said adder;

a first level detector for detecting the level of said uncompressed stereo difference signal;

a second level detector for detecting the level of said signal produced from said adder;

a comparator for comparing the output signals from said first and second level detectors and for producing a difference signal representing a difference therebetween, said difference signal being used for controlling said level control circuit;

a first filter for filtering the signal applied to said first level detector; and a second filter for filtering the signal applied to said second level detector.

4. An FMX stereophonic receiver as claimed in claim 3, further comprising a third filter connected in a line for transmitting said stereo sum signal and a fourth filter connected in a line for transmitting said uncompressed stereo difference signal or the signal produced from said level control circuit.

5. In an FMX stereophonic receiver for receiving an FMX stereophonic broadcast signal which includes a stereo sum signal, an uncompressed stereo difference signal, and a compressed stereo difference signal which is modulated in quadrature with the uncompressed stereo difference signal and being compressed, wherein said FMX stereophonic receiver comprises:

an FM detector for producing an FM detection signal including a stereo pilot signal;

a PLL circuit for producing a first signal which is in a synchronized relationship with said stereo pilot signal included in said FM detection signal;

a synchronous detection circuit for receiving said FM detection signal and for producing said uncompressed stereo difference signal in accordance with said signal produced from said PLL circuit;

a quadrature detection circuit for receiving said FM detection signal and for producing said compressed stereo difference signal in accordance with said signal produced from said PLL circuit;

a phase shifting means for shifting the phase of at least one of said FM detection signal applied to said PLL circuit and said FM detection signal applied to said detection circuits so as to correct the phase difference between the synchronized relationship signal and the signals to be detected in said detection circuits, said phase shifting means being inserted at the input side of said detection circuits.

6. In an FMX stereophonic receiver for receiving an FMX stereophonic broadcast signal which includes a stereo sum signal, an uncompressed stereo difference signal, and a compressed stereo difference signal which is modulated in quadrature with the uncompressed stereo difference signal and being compressed, wherein said FMX stereophonic receiver comprises:

an FM detector for producing an FM detection signal including a stereo pilot signal;

a PLL circuit for producing a signal which is in a synchronized relationship with said stereo pilot signal included in said FM detection signal;

a synchronous detection circuit for receiving said FM detection signal and for producing said uncompressed stereo difference signal in accordance with said signal produced from said PLL circuit;

a quadrature detection circuit for receiving said FM detection signal and for producing said compressed stereo difference signal in accordance with said signal produced from said PLL circuit;

a phase shifting means for shifting the phase of at least one of said FM detection signal applied to said PLL circuit and said FM detection signal applied to said detection circuits so as to correct the phase difference between the synchronized relationship signal and the signals to be detected in said detection circuits, an adder for adding said uncompressed stereo difference signal and said compressed stereo difference signal;

a level control circuit for controlling the level of the output signal obtained from said adder;

a level detector for detecting the level of a signal applied thereto;

first and second storing means;

a first switching means for selectively connecting said input of said level detector to a first connected position to receive said uncompressed stereo difference signal or to a second connected position to receive the output signal from said level control circuit;

a second switching means for selectively connecting said output of said level detector to a third connected position to apply the output of said level detector to said first storing means or to a fourth connected position to apply the output of said level detector to said second storing means;

a switch control means for controlling said first and second switching means to make said first and third connected positions at the same time, and to make said second and fourth connected positions at the same time, alternately at a frequency which is substantially higher than the frequency of said uncompressed stereo difference signal and of said signal produced from said level control circuit; and a comparator for comparing the signals stored in said first and second storing means and for producing a difference signal representing a difference therebetween, said difference signal being used for controlling said level control circuit.

7. In an FMX stereophonic receiver for receiving an FMX stereophonic broadcast signal which includes a stereo sum signal, an uncompressed stereo difference signal, and a compressed stereo difference signal which is formed by modulating the uncompressed stereo difference signal by a quadrature modulation and being compressed, wherein said FMX stereophonic receiver comprises:

an FM detector for producing an FM detection signal including a stereo pilot signal and a stereo sum signal;

a PLL circuit for being locked with respect to said stereo pilot signal included in said FM detection signal and for producing a first signal having a frequency equal to that of a stereo subcarrier signal, and a second signal which is 90° phase shifted signal of said first signal;

a first synchronous detection circuit for receiving said FM detection signal and for producing said uncompressed stereo difference signal in accordance with said first signal produced from said PLL circuit;

a second synchronous detection circuit for receiving said FM detection signal and for producing said compressed stereo difference signal in accordance with said second signal produced from said PLL circuit; and an adder of adding said uncompressed stereo difference signal and said compressed stereo difference signal as produced from said first and second synchronous detection circuits;

an expander for expanding said output signal from said adder in accordance with the signal produced from said first synchronous detection circuit;

selecting means for selecting either one of the output signal from said first synchronous detection circuit or the output signal from said expander;

a matrix circuit for producing left and right stereo signals in accordance with said sum signal included in said FM detection signal and the signal produced from said selecting means; and a phase shifting means connected between said FM detector and said first synchronous detection circuit for shifting the phase of said stereo subcarrier signal, thereby improving the separation of the left and right stereo signals.

8. In an FMX stereophonic receiver for receiving an FMX stereophonic broadcast signal which includes a stereo sum signal, an uncompressed stereo difference signal, and a compressed stereo difference signal which is formed by modulating the uncompressed stereo difference signal by a quadrature modulation and being compressed, wherein said FMX stereophonic receiver comprises:

an FM detector for producing an FM detection signal including a stereo pilot signal and a stereo sum signal;

a PLL circuit for being locked with respect to said stereo pilot signal included in said FM detection signal and for producing a first signal having a frequency equal to that of a stereo subcarrier signal, and a second signal which is 90° phase shifted signal of said first signal;

a first synchronous detection circuit for receiving said FM detection signal and for producing said uncompressed stereo difference signal in accordance with said first signal produced from said PLL circuit;

a second synchronous detection circuit for receiving said FM detection signal and for producing said compressed stereo difference signal in accordance with said second signal produced from said PLL circuit; and an adder for adding said uncompressed stereo difference signal and said compressed stereo difference signal as produced from said first and second synchronous detection circuits;

an expander for expanding said output signal from said adder in accordance with the signal produced from said first synchronous detection circuit;

selecting means for selecting either one of the output signal from said first synchronous detection circuit or the output signal from said expander;

a matrix circuit for producing left and right stereo signals in accordance with said sum signal included in said FM detection signal and the signal produced from said selecting means;

a level adjusting circuit for adjusting the level of the output signal produced from said adder;

a level detector for detecting the level of a signal applied thereto;

first and second storing means;

a first switching means for selectively connecting said input of said level detector to a first connected position to receive said uncompressed stereo difference signal or to a second connected position to receive the output signal from said level control circuit;

a second switching means for selectively connecting said output of said level detector to a third connected position to apply the output of said level detector to said first storing means or to a fourth connected position to apply the output of said level detector to said second storing means;

a switch control means for controlling said first and second switching means to make said first and third connected positions at the same time, and to make said second and fourth connected positions at the same time, alternately at a frequency which is substantially higher than the frequency of said uncompressed stereo difference signal and of said signal produced from said level control circuit; and a comparator for comparing the signals stored in said first and second storing means and for producing a difference signal representing a difference therebetween, said difference signal being used for controlling said level control circuit.

* * * * *